(12) United States Patent
Cho et al.

(10) Patent No.: US 8,629,547 B2
(45) Date of Patent: Jan. 14, 2014

(54) SEMICONDUCTOR CHIP PACKAGE

(75) Inventors: Kyong-Soon Cho, Goyang-si (KR);
Chang-Su Kim, Hwaseong-si (KR);
Kwan-Jai Lee, Yongin-si (KR);
Kyoung-Sei Choi, Yongin-si (KR);
Jae-Hyok Ko, Hwaseong-si (KR);
Keung-Beum Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 182 days.

(21) Appl. No.: 13/181,920

(22) Filed: Jul. 13, 2011

(65) Prior Publication Data

US 2012/0074540 A1    Mar. 29, 2012

(30) Foreign Application Priority Data

Sep. 29, 2010    (KR) .................. 10-2010-0094318

(51) Int. Cl.
*H01L 23/48*    (2006.01)
(52) U.S. Cl.
USPC .............. 257/688; 257/698; 257/E23.015; 174/250; 174/267; 361/152; 361/777
(58) Field of Classification Search
USPC ......... 257/678, 696, 697, 698, 699, 700, 728, 257/734, 735, 736, 737, 738, 758, 784, 786, 257/E23.015; 361/601, 777, 152; 174/250, 174/255, 261, 267
See application file for complete search history.

(56) References Cited

U.S. PATENT DOCUMENTS

| 7,874,491 | B2 * | 1/2011 | Janke et al. ................... 235/492 |
| 2009/0250521 | A1 | 10/2009 | Fujita et al. |
| 2011/0228432 | A1 * | 9/2011 | Onishi et al. ................... 361/56 |

FOREIGN PATENT DOCUMENTS

| JP | 11-250209 A | 9/1999 |
| KR | 10-0875952 A | 3/2008 |
| WO | WO2010/058715 | * 5/2010 |

* cited by examiner

*Primary Examiner* — William D Coleman
*Assistant Examiner* — Su Kim
(74) *Attorney, Agent, or Firm* — Sughrue Mion, PLLC

(57) ABSTRACT

A structure of a semiconductor chip package is provided. The semiconductor chip package includes: a substrate; a semiconductor chip mounted on a first surface of the substrate; a plurality of electrode pads on a second surface, different from the first surface, of the substrate; and an electrostatic discharge protection pad overlapping a portion of a first electrode pad and a portion of a second electrode pad among the plurality of electrode pads.

19 Claims, 9 Drawing Sheets

SEMICONDUCTOR CHIP PACKAGE

CROSS-REFERENCE TO RELATED APPLICATION

This application claims priority from Korean Patent Application No. 10-2010-0094318 filed on Sep. 29, 2010 in the Korean Intellectual Property Office, the disclosure of which is incorporated herein in its entirety by reference.

BACKGROUND

1. Field

Apparatuses and methods consistent with exemplary embodiments relate to a semiconductor chip package, and more particularly to a semiconductor chip package for a smart card.

2. Description of the Related Art

A semiconductor chip package has been developed to meet requirements such as multiple functions, high capacity and miniaturization. Recently, a smart card easy to carry while maintaining confidentiality of data is being used and a semiconductor chip package for a smart card has been manufactured to be applied to an assembly of such a smart card.

A smart card or an integrated circuit (IC) card is used as a microprocessor-based portable unit. The smart card refers to a card into which an integrated circuit is inserted, and may include an integrated circuit processor, a small-capacity memory, an interface card and the like.

Generally, a smart card module, which is inserted into a smart card, may include a substrate on which a semiconductor chip is mounted. The semiconductor chip and the like may be mounted on one surface of the substrate and electrode pads may be formed on the other surface of the substrate. The electrode pads formed on the substrate may be electrically connected to the semiconductor chip.

However, when static electricity having relatively high intensity is applied to any one of the electrode pads electrically connected to the semiconductor chip, an internal circuit of the semiconductor chip may be damaged or performance of the chip may be deteriorated.

SUMMARY

Aspects of exemplary embodiments provide a semiconductor chip package with improved reliability and process yield.

Aspects are not limited thereto, and other aspects will be described in or be apparent from the following description of exemplary embodiments.

According to an aspect of an exemplary embodiment, there is provided a semiconductor chip package including: a substrate; a semiconductor chip mounted on a surface of the substrate; a plurality of electrode pads formed on another surface of the substrate; and an electrostatic discharge protection pad overlapping a portion of each of a first electrode pad and a second electrode pad among the plurality of electrode pads.

According to an aspect of another exemplary embodiment, there is provided a semiconductor chip package including: a substrate; a semiconductor chip mounted on a surface of the substrate; a plurality of electrode pads on another surface of the substrate; and an electrostatic discharge protection pad in direct contact with a portion of each of a first electrode pad and a second electrode pad among the plurality of electrode pads.

According to an aspect of another exemplary embodiment, there is provided a method of manufacturing a semiconductor chip package, the method including: mounting a semiconductor chip on a first surface of a substrate; providing a plurality of electrode pads on a second surface, different from the first surface, of the substrate, the plurality of electrode pads including a first electrode pad and a second electrode pad; and forming an electrostatic discharge protection pad to overlap a portion of the first electrode pad and a portion of the second electrode pad.

Other aspects are exemplified in the detailed description and drawings.

BRIEF DESCRIPTION OF THE DRAWINGS

The above and other aspects and features will become more apparent by describing in detail exemplary embodiments with reference to the attached drawings, in which.

DETAILED DESCRIPTION OF EXEMPLARY EMBODIMENTS

Figure 1:
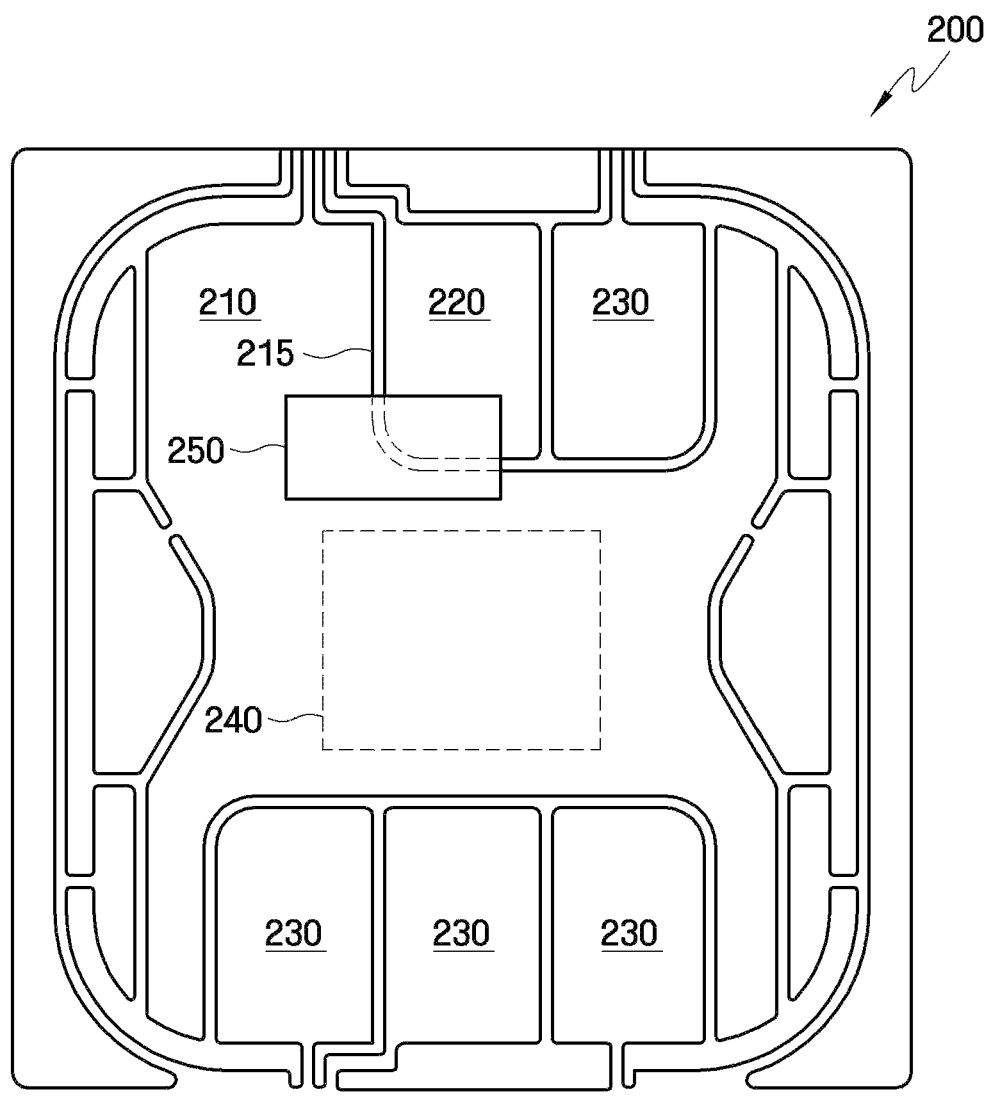
FIG. 1 is a rear view of a semiconductor chip package in accordance with an exemplary embodiment.

Advantages and features and methods of accomplishing the same may be understood more readily by reference to the following detailed description of exemplary embodiments and the accompanying drawings. An exemplary embodiment may, however, be embodied in many different forms and should not be construed as being limited to the exemplary embodiments set forth herein. Rather, these exemplary embodiments are provided so that this disclosure will be thorough and complete and will fully convey the concept to those skilled in the art, and the present invention will only be defined by the appended claims. Throughout the specification, like reference numerals in the drawings denote like elements.

It will be understood that when an element or a layer is referred to as being "on" or "connected to" another element or layer, it can be directly on or directly connected to the other element, or intervening elements may also be present. In contrast, when an element is referred to as being "directly on" or "directly connected to" another element, there are no intervening elements present. Like numbers refer to like elements throughout. As used herein, the term "and/or" includes any and all combinations of one or more of the associated listed items.

It will be understood that, although the terms first, second, etc., may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A semiconductor chip package in accordance with exemplary embodiments, which will be described below, may be embedded in a smart card module embedded in a smart card body. In other words, the semiconductor chip package in accordance with exemplary embodiments may be used for, e.g., a smart card.

Figure 2:
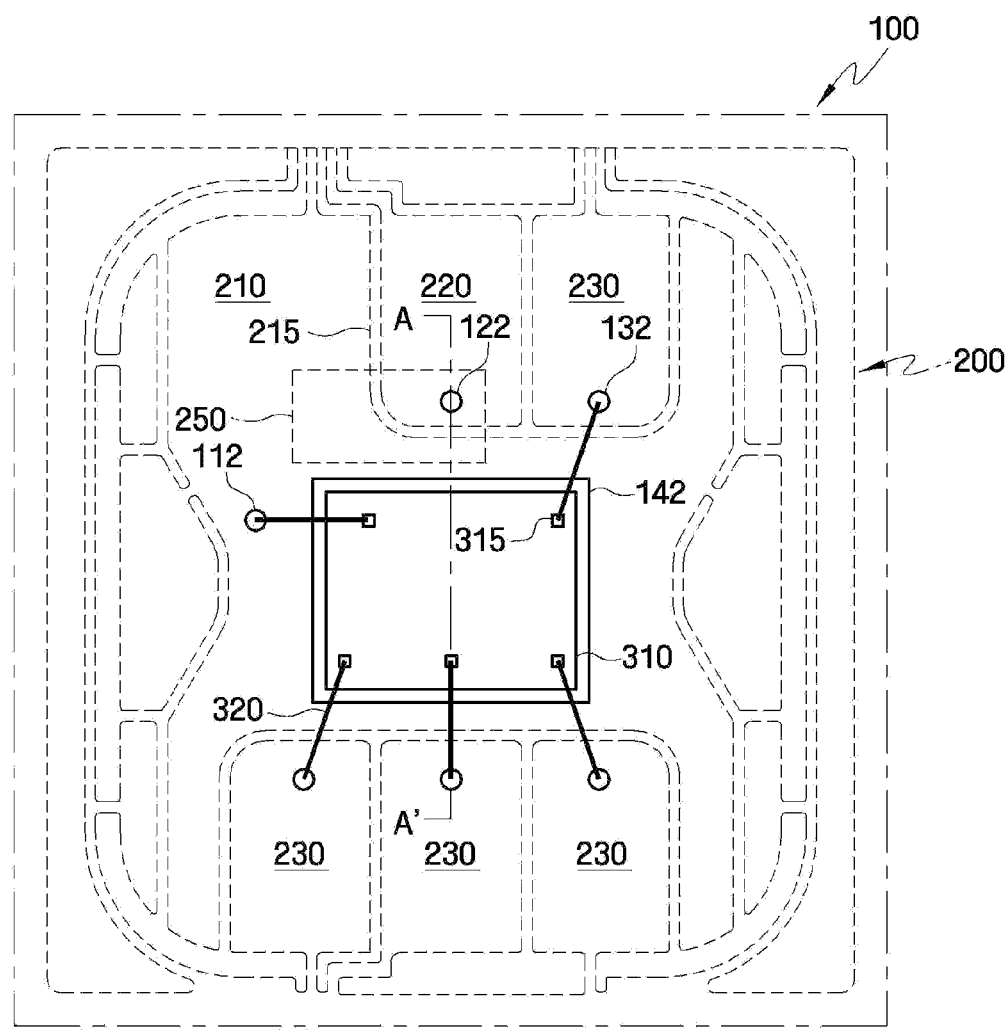
FIG. 2 is a top view of the semiconductor chip package in accordance with an exemplary embodiment.
Figure 3:
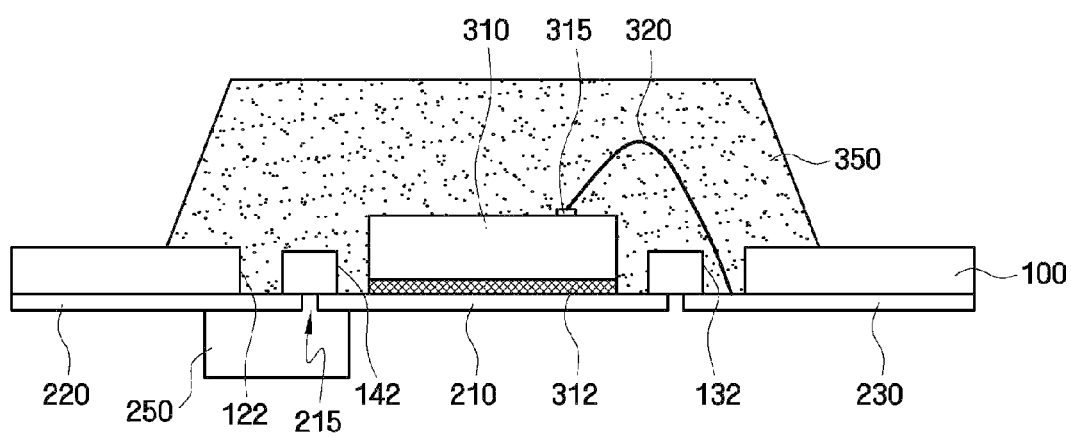
FIG. 3 is a cross-sectional view taken along line A-A' of FIG. 2.

Hereinafter, a semiconductor chip package 200 in accordance with an exemplary embodiment will be described with reference to FIGS. 1 to 3. FIG. 1 is a rear view of the semiconductor chip package 200 in accordance with an exemplary embodiment. FIG. 2 is a top view of the semiconductor chip package 200 in accordance with an exemplary embodiment. FIG. 3 is a cross-sectional view taken along line A-A' of FIG. 2.

As shown in FIGS. 1 to 3, a semiconductor chip package 200 in accordance with an exemplary embodiment includes a semiconductor chip 310, a plurality of electrode pads 210, 220 and 230, and an electrostatic discharge protection pad 250.

A substrate 100 may be, e.g., an insulating substrate. In some exemplary embodiments, the substrate 100 may include a first surface and a second surface. The semiconductor chip 310 is mounted on the first surface of the substrate 100 and the electrode pads 210, 220 and 230 are formed or located on the second surface of the substrate 100. The electrode pads 210, 220 and 230 include a first electrode pad 210 and a second electrode pad 220. The electrostatic discharge protection pad 250 overlaps a portion of the first electrode pad 210 and a portion of the second electrode pad 220.

In this case, as shown in FIG. 1, the electrostatic discharge protection pad 250 may be disposed on the second surface of the substrate 100 in direct contact with the first electrode pad 210 and the second electrode pad 220.

The electrode pads 210, 220 and 230 may be disposed on the second surface of the substrate 100. Further, the electrode pads 210, 220 and 230 may include the first electrode pad 210, the second electrode pad 220 and third electrode pads 230. For example, the first electrode pad 210 may be a ground electrode pad to which a ground voltage is applied, and the second electrode pad 220 may be a non-connected pad (NC pad). Appropriate voltages corresponding to the respective pads may be applied to the third electrode pads 230. In other words, the electrode pads 210, 220 and 230 may receive signals, e.g., voltages from the outside and transmit the signals to the semiconductor chip 310.

In this case, the first electrode pad 210 and the second electrode pad 220 overlap or contact the electrostatic discharge protection pad 250 while the third electrode pads 230 neither overlap nor contact the electrostatic discharge protection pad 250.

As shown in the drawings, the first electrode pad 210 may include a semiconductor chip mounting area 240 on which the semiconductor chip 310 is mounted. The other electrode pads, e.g., the second electrode pad 220 and the third electrode pads 230, may be arranged in the vicinity of the first electrode pad 210. The electrode pads 210, 220 and 230 may be separated from each other by a separation region 215.

The electrostatic discharge protection pad 250 overlaps a portion of the first electrode pad 210 and a portion of the second electrode pad 220. In this case, the electrostatic discharge protection pad 250 is formed or provided so as not to overlap the semiconductor chip mounting area 240 on which the semiconductor chip 310 is mounted, so that the semiconductor chip 310 can be stably mounted on the substrate 100.

Further, in the semiconductor chip package 200 in accordance with the present exemplary embodiment, the electrostatic discharge protection pad 250 may be arranged on the second surface of the substrate 100 and formed or located on the first electrode pad 210 and the second electrode pad 220. As described above, the semiconductor chip 310 is mounted on the first surface of the substrate 100 and the electrode pads 210, 220 and 230 are on the second surface of the substrate 100. Accordingly, when the electrostatic discharge protection pad 250 is arranged on the second surface of the substrate 100, the first electrode pad 210 and the second electrode pad 220 may be on the rear surface of the substrate 100 and the electrostatic discharge protection pad 250 may be on the rear surfaces of the first electrode pad 210 and the second electrode pad 220. A detailed description thereof will be given below with reference to FIG. 3.

Further, the electrostatic discharge protection pad 250 may include a voltage sensitive material. In this case, the voltage sensitive material may be a material which ordinarily has an insulating property and is converted into a conductive material when electrostatic discharge is applied. The voltage sensitive material may include, e.g., resin and metallic particles. Specifically, the resin may include at least one of epoxy, urethane, acryl, and silicon. The metallic particles may include at least one of nickel, silicon and aluminum. The above-mentioned materials are merely exemplary, and it is understood that another exemplary embodiment is not limited thereto, and various materials applicable in the field of the present inventive concept may be used.

In a case where the electrostatic discharge protection pad 250 is of a voltage sensitive material, the electrostatic discharge protection pad 250 may become conductive when the electrostatic discharge is applied. Accordingly, when static electricity is introduced into the semiconductor chip 310, the first electrode pad 210 and the second electrode pad 220 may be electrically connected to each other by the electrostatic discharge protection pad 250.

As described above, in a case where the first electrode pad 210 is a ground electrode pad, the internally introduced static electricity may flow to the first electrode pad 210 through the electrostatic discharge protection pad 250. Accordingly, although static electricity having a relatively high voltage is introduced, it is possible to prevent degradation (e.g., damage or performance reduction) of the semiconductor chip 310.

In this case, the electrostatic discharge protection pad 250 may be formed on the first electrode pad 210 and the second electrode pad 220 by using, e.g., screen printing before wire bonding is performed after the semiconductor chip 310 has been adhered to the substrate 100. Alternatively, the electrostatic discharge protection pad 250 may be formed by performing a potting process before a molding process is performed after wire bonding has been performed.

Further, as shown in FIG. 2, the substrate 100 may include a plurality of connection vias 112, 122 and 132 passing through the substrate 100 to provide spaces for electrical connection between the electrode pads 210, 220 and 230 and the semiconductor chip 310, and a chip mounting trench 142 providing the semiconductor chip mounting area 240. The electrode pads 210, 220 and 230 are partially exposed by the connection vias 112, 122 and 132 of the substrate 100. The electrode pads 210, 220 and 230 exposed by the connection vias 112, 122 and 132 may be electrically connected with the semiconductor chip 310 through bonding wires 320 and chip pads 315.

Referring to FIG. 3, a sealant may be formed on the substrate 100 to cover the semiconductor chip 310 and the bonding wires 320. For example, a sealant 350 may include an epoxy molding compound (EMC) to achieve an excellent mechanical performance and a stable mechanical support.

In short, the semiconductor chip package in accordance with the present exemplary embodiment includes, as shown in FIG. 3, the semiconductor chip 310 mounted on the first surface of the substrate 100, a plurality of the electrode pads 210, 220 and 230 on the second surface of the substrate 100, and the electrostatic discharge protection pad 250 overlapping a portion of each of the first electrode pad 210 and the second electrode pad 220 included in the plurality of electrode pads 210, 220 and 230. The electrostatic discharge protection pad 250 may be on the first electrode pad 210 and the second electrode pad 220 arranged on the second surface of the substrate 100.

The electrostatic discharge protection pad 250 may include a voltage sensitive material. When the static electricity is introduced, the electrostatic discharge protection pad 250 becomes conductive such that the first electrode pad 210 and the second electrode pad 220 can be electrically connected to each other. In a case where the first electrode pad 210 is a ground electrode pad, the introduced static electricity takes a bypass to the ground electrode pad through the electrostatic discharge protection pad 250. Accordingly, it is possible to prevent damage of the semiconductor chip 310 due to static electricity, thereby improving reliability of the semiconductor chip package 200 and increasing process yield.

Figure 4:
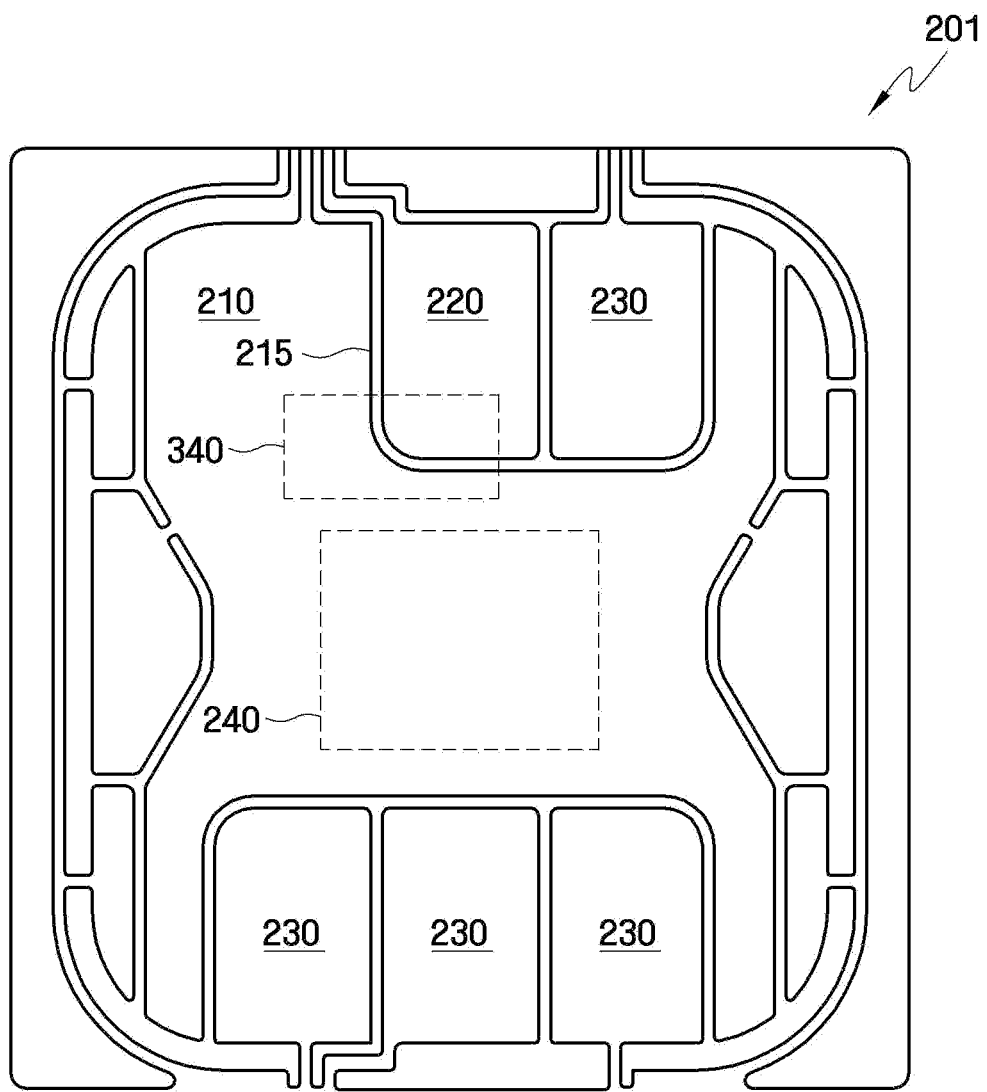
FIG. 4 is a rear view of a semiconductor chip package in accordance with another exemplary embodiment.
Figure 5:
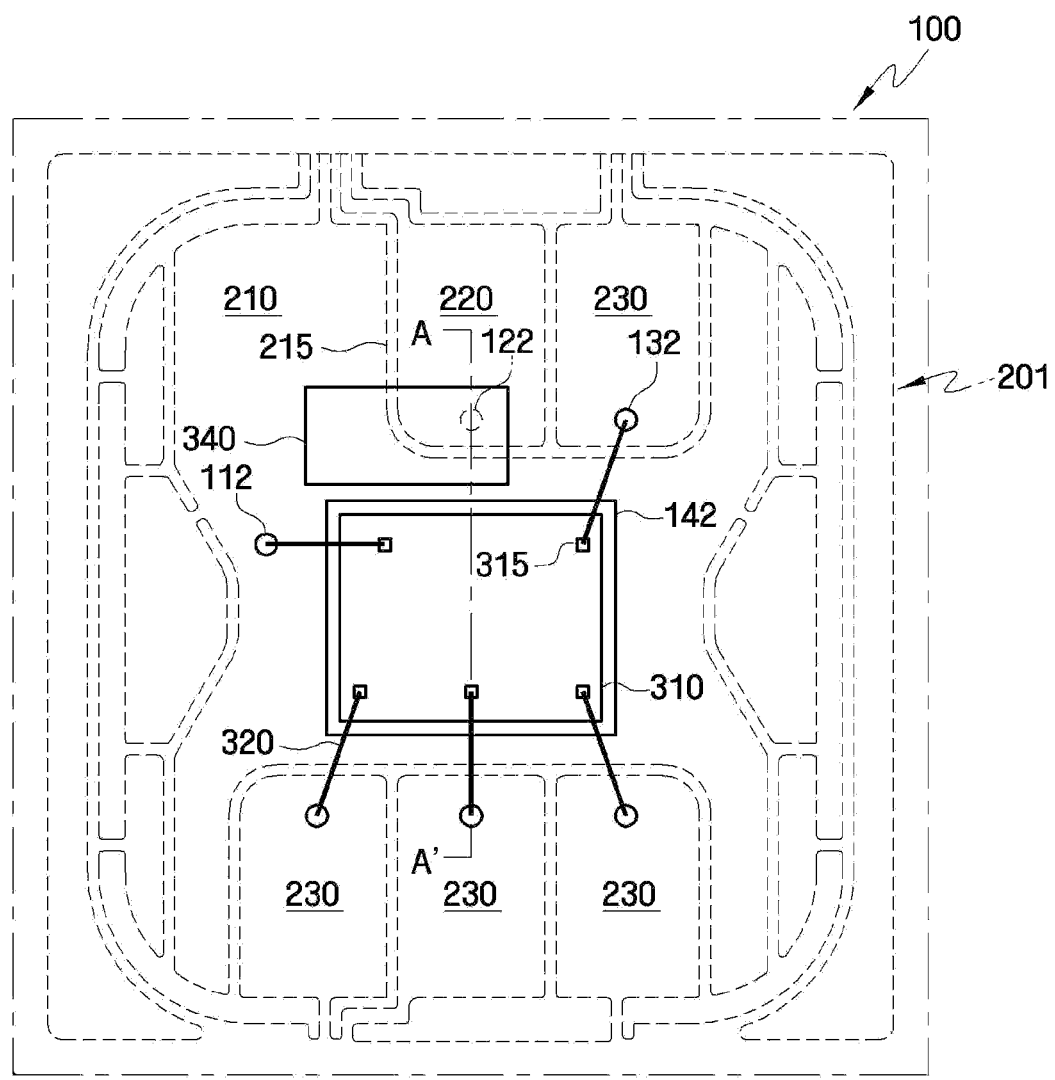
FIG. 5 is a top view of the semiconductor chip package in accordance with another exemplary embodiment.
Figure 6:
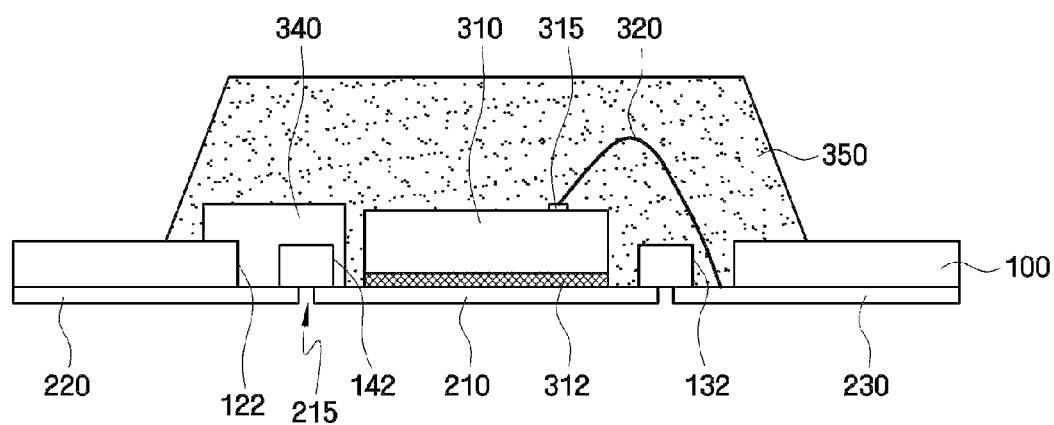
FIG. 6 is a cross-sectional view taken along line B-B' of FIG. 5.

Hereinafter, a semiconductor chip package 201 in accordance with another exemplary embodiment will be described with reference to FIGS. 4 to 6. FIG. 4 is a rear view of the semiconductor chip package 201 in accordance with another exemplary embodiment. FIG. 5 is a top view of the semiconductor chip package 201 in accordance with another exemplary embodiment. FIG. 6 is a cross-sectional view taken along line B-B' of FIG. 5.

A semiconductor chip package 201 in accordance with the present exemplary embodiment is distinguished from the semiconductor chip package 200 in accordance with the above-described exemplary embodiment in that an electrostatic discharge protection pad 340 is arranged on the first surface of the substrate 100. For convenience of explanation, a detailed description of substantially the same or similar elements as those of the above-described exemplary embodiment is omitted or simplified.

Referring to FIGS. 4 to 6, a semiconductor chip 310 is mounted on a first surface of the substrate 100, and a plurality of electrode pads 210, 220 and 230 are formed or located on a second surface of the substrate 100. Similarly, the electrostatic discharge protection pad 340 overlaps a portion of the first electrode pad 210 and a portion of the second electrode pad 220, but is formed or located on the first surface of the substrate 100.

As described above, the substrate 100 may include a plurality of connection vias 112, 122 and 132 passing through the substrate 100 to expose the electrode pads 210, 220 and 230. The exposed electrode pads 210, 220 and 230 may be electrically connected with the semiconductor chip 310 through bonding wires 320 and chip pads 315. Further, the substrate 100 may include a chip mounting trench 142 exposing a region corresponding to the semiconductor chip mounting area 240 (see FIG. 1) on which the semiconductor chip 310 is mounted in the first electrode pad 210. In other words, the substrate 100 may include a plurality of connection vias 112, 122 and 132 and the chip mounting trench 142. The electrode pads 210, 220 and 230 are exposed by the connection vias 112, 122 and 132, and the first electrode pad 210 including the semiconductor chip mounting area 240 may be exposed by the chip mounting trench 142.

Further, as shown in FIGS. 5 and 6, the electrostatic discharge protection pad 340 may be formed or provided to fill up a portion of the chip mounting trench 142 and the connection via 122 corresponding to the second electrode pad 220. As another point of view, the electrostatic discharge protection pad 340 is on the top surface of the substrate 100 to overlap a portion of the chip mounting trench 142 and the connection via 122. Accordingly, the electrostatic discharge protection pad 340 may be directly connected to the second electrode pad 220 through the second connection via 122 and directly connected to the first electrode pad 210 through the chip mounting trench 142.

In other words, the electrostatic discharge protection pad 340 is on the top surface of the substrate 100, and is directly connected to the second electrode pad 220 and the first electrode pad 210 through the second connection via 122 and the chip mounting trench 142, respectively. As described above, the electrostatic discharge protection pad 340 includes a voltage sensitive material that is converted into a conductive material when electrostatic discharge is applied. Accordingly, when the static electricity is applied to the electrostatic discharge protection pad 340, the first electrode pad 210 and the second electrode pad 220 may be electrically connected to each other via the electrostatic discharge protection pad 340. Accordingly, it is possible to prevent the semiconductor chip 310 from being damaged due to introduction of static electricity.

Similarly, the electrostatic discharge protection pad 340 may be formed on the top surface of the substrate 100 by using, e.g., a screen printing process to fill up the second connection via 122 and a portion of the chip mounting trench 142 before wire bonding is performed after the semiconductor chip 310 has been adhered to the substrate 100. Alternatively, the electrostatic discharge protection pad 340 may be formed by performing a potting process before a molding process is performed after wire bonding has been performed.

In short, the semiconductor chip package 201 in accordance with the present exemplary embodiment includes, as shown in FIG. 6, the semiconductor chip 310 mounted on the first surface of the substrate 100, a plurality of the electrode pads 210, 220 and 230 on the second surface of the substrate 100, and the electrostatic discharge protection pad 340 overlapping a portion of each of the first electrode pad 210 and the second electrode pad 220 included in the plurality of electrode pads 210, 220 and 230. The electrostatic discharge protection pad 340 may be on the first surface of the substrate 100 to fill up the second connection via 122 and a portion of the chip mounting trench 142.

Further, the electrostatic discharge protection pad 340 may include a voltage sensitive material. When the static electricity is introduced, the electrostatic discharge protection pad 340 becomes conductive such that the first electrode pad 210 and the second electrode pad 220 can be electrically connected to each other. In a case where the first electrode pad 210 is a ground electrode pad, the introduced static electricity takes a bypass to the ground electrode pad through the electrostatic discharge protection pad 340. Accordingly, it is possible to prevent the semiconductor chip 310 from being damaged due to introduction of static electricity, thereby improving reliability of the semiconductor chip package 201 and increasing process yield.

Figure 7:
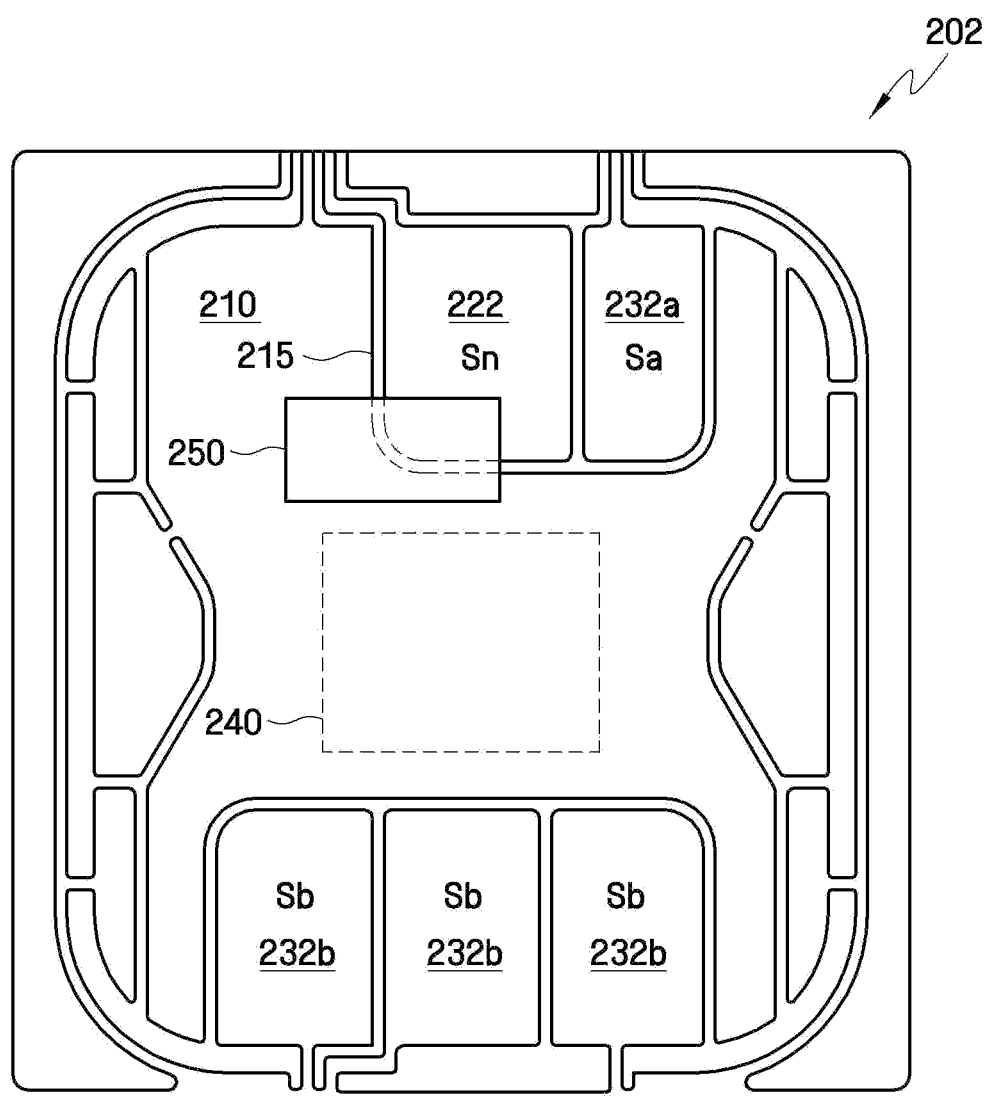
FIG. 7 is a rear view of a semiconductor chip package in accordance with still another exemplary embodiment.

Hereinafter, a semiconductor chip package 202 in accordance with still another exemplary embodiment will be described with reference to FIG. 7. FIG. 7 is a rear view of the semiconductor chip package 202 in accordance with still another exemplary embodiment.

A semiconductor chip package 202 in accordance with the present exemplary embodiment is distinguished from the semiconductor chip packages 200 and 201 in accordance with the above-described exemplary embodiments in that the semiconductor chip package 202 includes third electrode pads 232a and 232b, and each of the third electrode pads 232a and 232b has an area smaller than that of the first electrode pad 210 or a second electrode pad 222. For convenience of explanation, a detailed description of substantially the same or similar elements as those of the above-described exemplary embodiments is omitted or simplified.

As shown in FIG. 7, a plurality of electrode pads 210, 222, 232a and 232b may include the third electrode pads 232a and 232b which do not overlap the electrostatic discharge protection pad 250. In this case, the first electrode pad 210 has a first area, the second electrode pad 222 has a second area, and the third electrode pads 232a and 232b have a third area. The third area of the third electrode pads 232a and 232b may be smaller than the first area of the first electrode pad 210 and the second area of the second electrode pad 222.

Specifically, when the first electrode pad 210 is a ground electrode pad, the first electrode pad 210 may have the largest area among a plurality of the electrode pads 210, 222, 232a and 232b. As shown in FIG. 7, the second electrode pad 222 may have an area larger than that of each of the third electrode pads 232a and 232b. In other words, when the first electrode pad 210 is a ground electrode pad, the first area of the first electrode pad 210 is the largest, and the second area of the second electrode pad 222 overlapping the electrostatic discharge protection pad 250 may be smaller than the first area, and larger than that of each of the third electrode pads 232a and 232b which do not overlap the electrostatic discharge protection pad 250.

In a case where the second area is larger than the third area, when static electricity is introduced into the semiconductor chip package 202, electrostatic discharge can be applied to the second electrode pad 222. Accordingly, the electrostatic discharge protection pad 250 becomes conductive such that the first electrode pad 210 and the second electrode pad 222 are electrically connected to each other, thereby allowing electrostatic discharge to take a bypass to the first electrode pad 210 serving as a ground electrode pad.

Therefore, in the semiconductor chip package 202 in accordance with the present exemplary embodiment, the second electrode pad 222 overlapping or in contact with the electrostatic discharge protection pad 250 is formed or provided to have an area larger than that of each of the third electrode pads 232a and 232b which do not overlap or contact the electrostatic discharge protection pad 250, thereby guiding static electricity introduced into the semiconductor chip package 202 to the second electrode pad 222 instead of the third electrode pads 232a and 232b, and allowing electrostatic discharge to stably take a bypass to the electrostatic discharge protection pad 250. Accordingly, it is possible to more efficiently prevent the semiconductor chip package 202 from being damaged due to static electricity, thereby improving reliability of the semiconductor chip package 202 and increasing process yield.

Figure 8:
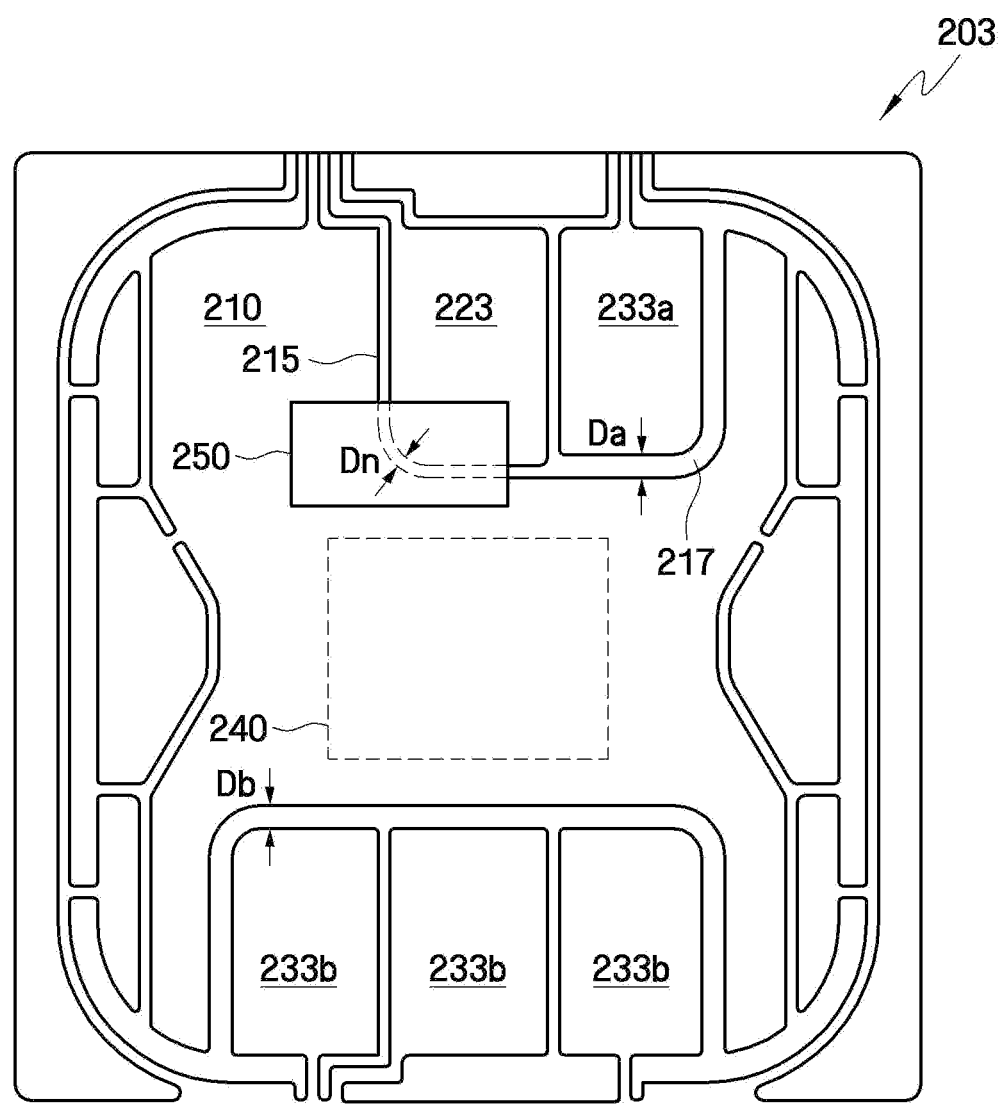
FIG. 8 is a rear view of a semiconductor chip package in accordance with still another exemplary embodiment.

Hereinafter, a semiconductor chip package 203 in accordance with still another exemplary embodiment will be described with reference to FIG. 8. FIG. 8 is a rear view of the semiconductor chip package 203 in accordance with still another exemplary embodiment.

A semiconductor chip package 203 in accordance with the present exemplary embodiment is distinguished from the semiconductor chip packages 200, 201, and 202 in accordance with the above-described exemplary embodiments in that the semiconductor chip package 203 according to the present exemplary embodiment includes third electrode pads 233a and 233b, and each of the third electrode pads 233a and 233b is separated from the first electrode pad 210 by a distance that is larger than a distance between the first electrode pad 210 and a second electrode pad 223. For convenience of explanation, a detailed description of substantially the same elements as those of the above-described exemplary embodiments is omitted or simplified.

As shown in FIG. 8, a plurality of the electrode pads 210, 223, 233a and 233b may include the third electrode pads 233a and 233b which do not overlap the electrostatic discharge protection pad 250. In this case, a distance between the first electrode pad 210 and the second electrode pad 223 may be a first distance Dn, and distances between the first electrode pad 210 and the third electrode pads 233a and 233b may be second distances Da and Db. The first distance Dn may be smaller than the second distances Da and Db.

Specifically, in a case where the first electrode pad 210 is a ground electrode pad, the second electrode pad 223 may be formed or provided to be the nearest to the first electrode pad 210. In other words, in a case where the first electrode pad 210 is a ground electrode pad, the second electrode pad 223 overlapping the electrostatic discharge protection pad 250 may be arranged to be the nearest to the first electrode pad 210. On the other hand, the third electrode pads 233a and 233b which do not overlap the electrostatic discharge protection pad 250 may be separated from the first electrode pad 210 by a distance larger than a distance by which the second electrode pad 223 is separated from the first electrode pad 210.

For example, as shown in FIG. 8, the third electrode pads 233a and 233b may be separated from the first electrode pad 210 by a relatively large distance by providing the second distances Da and Db of a separation region 217 between the first electrode pad 210 and the third electrode pads 233a and 233b to be larger than the first distance Dn of a separation region 215 between the first electrode pad 210 and the second electrode pad 223. Although a plurality of the third electrode pads 233a and 233b are separated from the first electrode pad 210 by the same distance in the FIG. 8, the plurality of the third electrode pads 233a and 233b may be separated from the first electrode pad 210 by different distances which are larger than the first distance Dn.

In a case where the first distance Dn is smaller than the second distances Da and Db, when static electricity is introduced into the semiconductor chip package 203, electrostatic discharge can be applied to the second electrode pad 223. Accordingly, the electrostatic discharge protection pad 250 becomes conductive such that the first electrode pad 210 and the second electrode pad 223 are electrically connected to each other, thereby allowing electrostatic discharge to take a bypass to the first electrode pad 210 serving as a ground electrode pad.

Therefore, in the semiconductor chip package 203 in accordance with the present exemplary embodiment, the second electrode pad 223 overlapping or in contact with the electrostatic discharge protection pad 250 is separated from the first electrode pad 210 by a distance smaller than a distance by which each of the third electrode pads 233a and 233b which do not overlap or contact the electrostatic discharge protection pad 250 is separated from the first electrode pad 210, thereby guiding static electricity introduced into the semiconductor chip package 203 to the second electrode pad 223 instead of the third electrode pads 233a and 233b, and allowing electrostatic discharge to stably take a bypass to the electrostatic discharge protection pad 250. Accordingly, it is possible to more efficiently prevent the semiconductor chip 310 from being damaged due to static electricity, thereby further improving reliability of the semiconductor chip package 203 and increasing process yield.

Figure 9:
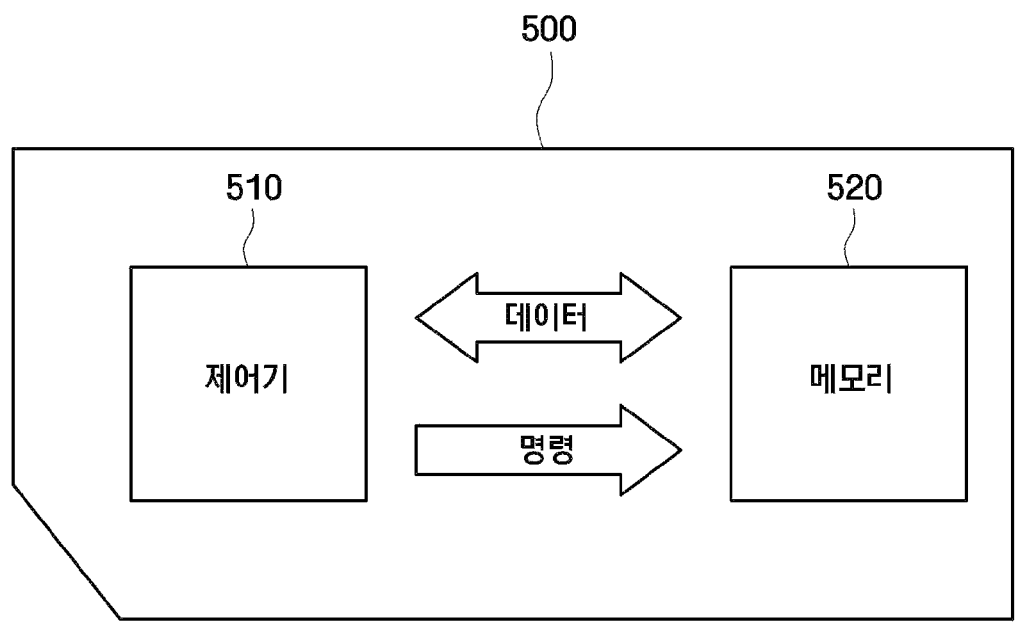
FIG. 9 schematically illustrates one example of a smart card in accordance with an exemplary embodiment.

FIG. 9 schematically illustrates one example of a smart card 500 in accordance with an exemplary embodiment.

Referring to FIG. 9, a controller 510 and a memory 520 may be arranged to exchange electrical signals. For example, the memory 520 and the controller 510 may exchange data according to commands of the controller 510. The smart card 500 may communicate with an external device in a non-contact or contact manner to store data or output data from the memory 520 to the external device. For instance, the memory 520 may include a semiconductor module 300 of FIG. 6.

The smart card 500 may be used in a memory card serving as a data storage medium or a credit card which data can be inputted to or outputted from. For example, a memory card may include a multi media card (MMC) or a secure digital (SD) card.

While exemplary embodiments have been particularly shown and described above, it will be understood by those of ordinary skill in the art that various changes in form and detail may be made therein without departing from the spirit and scope of the present inventive concept as defined by the following claims. The exemplary embodiments should be considered in a descriptive sense only and not for purposes of limitation.

What is claimed is:

1. A semiconductor chip package comprising:
a substrate;
a semiconductor chip mounted on a first surface of the substrate;
a plurality of electrode pads on a second surface, different from the first surface, of the substrate, the plurality of electrode pads comprising a first electrode pad and a second electrode pad; and
an electrostatic discharge protection pad overlapping a portion of the first electrode pad and a portion of the second electrode pad,
wherein the first electrode pad is a ground electrode pad, and the second electrode pad is a non-connected (NC) pad.

2. The semiconductor chip package of claim 1, wherein the electrostatic discharge protection pad comprises a voltage sensitive material having an insulating property, which is converted into a conductive material when electrostatic discharge is applied to the electrostatic discharge protection pad.

3. The semiconductor chip package of claim 2, wherein when the electrostatic discharge is applied, the first electrode pad is electrically connected to the second electrode pad by the electrostatic discharge protection pad.

4. The semiconductor chip package of claim 2, wherein the voltage sensitive material comprises resin and metallic particles.

5. The semiconductor chip package of claim 4, wherein the resin comprises at least one of epoxy, urethane, acryl, and silicon, and the metallic particles comprise at least one of nickel, silicon, and aluminum.

6. The semiconductor chip package of claim 1, wherein the electrostatic discharge protection pad is disposed on the first surface of the substrate in direct contact with a portion of the first electrode pad and a portion of the second electrode pad.

7. The semiconductor chip package of claim 6, wherein:
the substrate comprises:
a plurality of connection vias passing through the substrate to provide spaces for electrical connection between the plurality of electrode pads and the semiconductor chip, and
a chip mounting trench providing an area on which the semiconductor chip is mounted; and
the electrostatic discharge protection pad fills up a portion of the chip mounting trench, and a first connection via corresponding to the first electrode pad.

8. The semiconductor chip package of claim 1, wherein the electrostatic discharge protection pad is disposed on the second surface of the substrate in direct contact with a portion of the first electrode pad and a portion of the second electrode pad.

9. The semiconductor chip package of claim 1, wherein:
the plurality of electrode pads further comprises a third electrode pad which does not overlap the electrostatic discharge protection pad; and
the first electrode pad has a first area, the second electrode pad has a second area, and the third electrode pad has a third area, and the third area of the third electrode pad is smaller than the first area of the first electrode pad and the second area of the second electrode pad.

10. The semiconductor chip package of claim 1, wherein:
the plurality of electrode pads further comprises a third electrode pad which does not overlap the electrostatic discharge protection pad; and
when the first electrode pad is a ground electrode pad, a first distance between the first electrode pad and the second electrode pad is smaller than a second distance between the first electrode pad and the third electrode pad.

11. The semiconductor chip package of claim 1, wherein the electrostatic discharge protection pad does not overlap the semiconductor chip.

12. The semiconductor chip package of claim 1, wherein the semiconductor chip package is comprised in a smart card.

13. A semiconductor chip package comprising:
a substrate;
a semiconductor chip mounted on a first surface of the substrate;
a plurality of electrode pads on a second surface, different from the first surface, of the substrate, the plurality of electrode pads comprising a first electrode pad and a second electrode pad; and
an electrostatic discharge protection pad in direct contact with a portion the first electrode pad and a portion of the second electrode pad,
wherein the first electrode pad is a ground electrode pad, and the second electrode pad is a non-connected (NC) pad.

14. The semiconductor chip package of claim 13, wherein the electrostatic discharge protection pad comprises a voltage sensitive material having an insulating property, which is converted into a conductive material when electrostatic discharge is applied to the electrostatic discharge protection pad.

15. The semiconductor chip package of claim 14, wherein the voltage sensitive material comprises resin and metallic particles.

16. The semiconductor chip package of claim 13, wherein the electrostatic discharge protection pad is disposed on the first surface or the second surface of the substrate.

17. The semiconductor chip package of claim 13, wherein:
the plurality of electrode pads further comprises a third electrode pad which does not overlap the electrostatic discharge protection pad; and
the first electrode pad has a first area, a second electrode pad has a second area, and the third electrode pad has a third area, and the third area of the third electrode pad is smaller than the first area of the first electrode pad and the second area of the second electrode pad.

18. The semiconductor chip package of claim 13, wherein:
the plurality of electrode pads further comprises a third electrode pad which does not overlap the electrostatic discharge protection pad; and
when the first electrode pad is a ground electrode pad, a first distance between the first electrode pad and the second electrode pad is smaller than a second distance between the first electrode pad and the third electrode pad.

19. The semiconductor chip package of claim 1, wherein part of the first electrode pad overlaps the semiconductor chip and the electrostatic discharge protection pad does not overlap the semiconductor chip.

\* \* \* \* \*